United States Patent [19]
Berkman et al.

[11] 4,386,255
[45] May 31, 1983

[54] SUSCEPTOR FOR ROTARY DISC REACTOR

[75] Inventors: Samuel Berkman, Florham Park; John F. Corboy, Ringoes, both of N.J.

[73] Assignee: RCA Corporation, New York, N.Y.

[21] Appl. No.: 300,238

[22] Filed: Sep. 8, 1981

Related U.S. Application Data

[63] Continuation of Ser. No. 104,369, Dec. 17, 1979, abandoned, which is a continuation-in-part of Ser. No. 948,106, Oct. 3, 1978, abandoned.

[51] Int. Cl.³ .................. H05B 6/10; C23C 13/04
[52] U.S. Cl. .................. 219/10.49 R; 219/10.67; 219/10.43; 219/10.79; 118/725; 118/730; 427/45.1
[58] Field of Search .............. 219/10.49 R, 10.67, 219/10.43, 10.79, 10.57; 118/725, 728, 729, 730-733, 500; 427/45.1-48; 156/DIG. 98, DIG. 73, 602, 613, 620; 148/174, 175

[56] References Cited

U.S. PATENT DOCUMENTS

| 891,657 | 6/1908 | Berry | 219/10.49 |
|---|---|---|---|
| 1,981,632 | 11/1934 | Northrup | 219/10.79 |
| 3,070,683 | 12/1962 | Moro-Lin et al. | 219/10.49 R |
| 3,236,993 | 2/1966 | Jones | 219/10.79 |
| 3,277,265 | 10/1966 | Reboux | 219/10.49 R |
| 3,696,223 | 10/1972 | Metcalf et al. | 219/10.49 R |
| 3,845,738 | 11/1974 | Berkman et al. | 118/725 |
| 3,892,940 | 7/1975 | Bloem et al. | 219/10.49 R |
| 3,980,854 | 9/1976 | Berkman et al. | 219/10.49 R |
| 4,046,984 | 9/1977 | Vial | 219/69 E |
| 4,062,318 | 12/1977 | Ban et al. | 118/728 |
| 4,082,865 | 4/1978 | Ban et al. | 427/253 |
| 4,109,128 | 8/1978 | Köhl | 219/10.43 |
| 4,113,547 | 9/1978 | Katz et al. | 219/10.49 R |

OTHER PUBLICATIONS

Method of Achieving Elevated Substrate Temp. During Vacuum Deposition, Horstmann et al., IBM Technical Disclosure Bulletin, vol. 15, No. 2, p. 448, Jul. 1972.

*Primary Examiner*—B. A. Reynolds
*Assistant Examiner*—Philip H. Leung
*Attorney, Agent, or Firm*—Birgit E. Morris; Donald S. Cohen; Thomas H. Magee

[57] ABSTRACT

A susceptor for use in a rotary disc reactor comprises a disc having a plurality of radial slots formed adjacent the periphery of the disc. The slots are circumferentially spaced from each other such that the oppositely-flowing heating currents in the sectors disposed between the slots are forced to be adjacent each other to cause a cancelling effect. A plurality of such discs may be supported in stack-like relationship by supporting posts having the ends thereof adapted to fit into the radial slots. Each disc also has radiation shielding means attached to and extending beyond the periphery thereof. The radiation shielding means is made of a material different from the susceptor material of the disc.

12 Claims, 8 Drawing Figures

SUSCEPTOR FOR ROTARY DISC REACTOR

This is a continuation of application Ser. No. 104,369, filed Dec. 17, 1979, abandoned, which is a continuation-in-part application of U.S. patent application Ser. No. 948,106, filed on Oct. 3, 1978 now abandoned.

BACKGROUND OF THE INVENTION

The invention relates to a susceptor of the type comprising a circular disc adapted to support a substrate in a rotary disc reactor.

In the production of certain semiconductor devices, an epitaxial layer of silicon on a substrate, such as a silicon wafer, is used as a starting material. The epitaxial layer of silicon is deposited upon the substrate in a chemical vapor-deposition (CVD) process wherein the substrate is supported on a graphite susceptor and heated to a high temperature. A volatile compound of silicon, such as silane ($SiH_4$), is introduced and thermally decomposed, or reacted with other gases or vapors, at the surface of the substrate to yield silicon which deposits on the substrate surface.

One type of apparatus for chemically vapor-depositing a material onto surfaces of a plurality of substrates within a reaction chamber is the rotary disc reactor. In this reactor, a plurality of disc-shaped susceptors for supporting the substrates within the chamber are positioned so that the major surfaces thereof are substantially parallel to each other in a stack-like arrangement and separated by a distance of about 5 millimeters. A plurality of gas nozzles are connected to a source of gas and positioned within the chamber so that the flow of gas therefrom is directed respectively into the spacings between the susceptors. An rf induction coil is positioned adjacent the chamber for heating the susceptors. For more detailed information on the method and apparatus of the rotary disc reactor, see U.S. Pat. Nos. 4,062,318 and 4,082,865 issued to Ban et al. on Dec. 13, 1977 and Apr. 4, 1978, respectively, and assigned to RCA Corporation.

In order to achieve the deposition of a uniform epitaxial layer having few cosmetic defects, it is necessary that the substrates heat substantially uniformly within a certain temperature range. This requires that the susceptor discs within the reactor be heated by the rf induction coil so that a large temperature gradient does not form across the surface of the disc. Referring to the prior art drawing of FIG. 1, there is shown the relative current flow when a circular graphite disc 10 is induction heated in the rotary disc reactor chamber. A large electrical current, illustrated as dotted lines 12, flows around the circumference of the disc 10 adjacent a circular recess 14 utilized for retaining the semiconductor substrate, while relatively very little current flows toward the center of the disc 10. This results in a large temperature gradient from the circumference of the disc 10, where the temperature is highest, inward to the center of the disc 10. Such a temperature gradient is undesirable when using certain CVD reactants in that it may result in the deposition of a non-uniform epitaxial layer upon the substrate. The present invention provides a novel susceptor structure for adjusting this temperature distribution in the susceptor disc 10.

DETAILED DESCRIPTION OF THE PREFERRED EMBODIMENT

Figure 1:
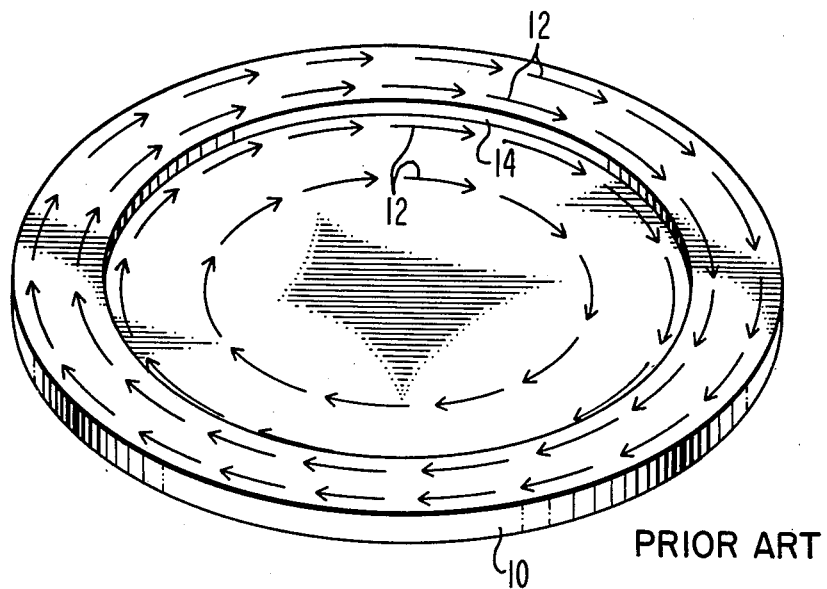
FIG. 1 is a prior art perspective view illustrating diagrammatically a typical current flow in a disc type susceptor.
Figure 2:
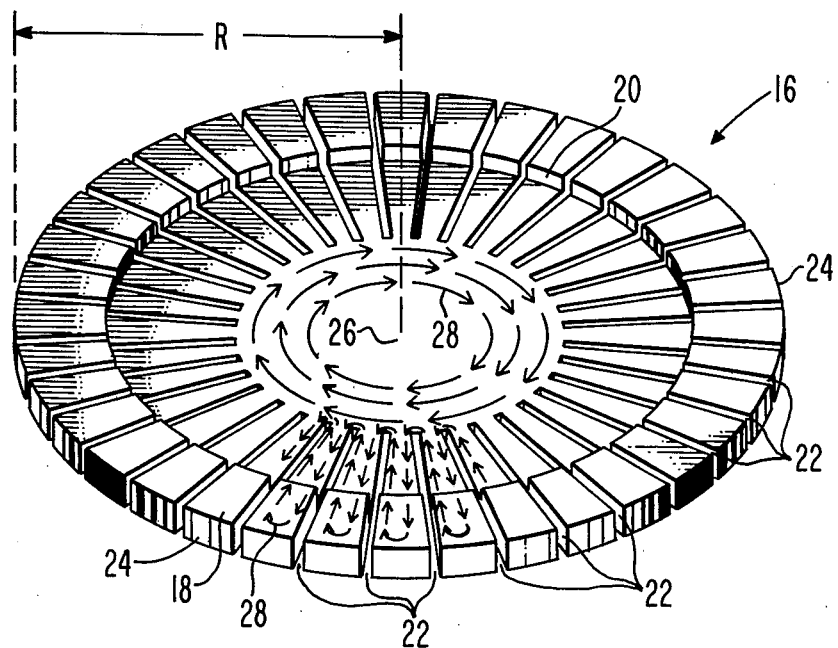
FIG. 2 is a perspective view showing one embodiment of the present novel susceptor disc and illustrating diagrammatically the current flow therein.

Referring to FIG. 2 of the drawings, there is shown one embodiment of a novel susceptor 16 comprising a disc 18 adapted for use in a rotary disc reactor. Such a disc 18 may have a circular recess 20 in the central portion thereof for holding a substrate (not shown), such as a semiconductor or sapphire wafer. The susceptor disc 18 has a plurality of radial openings 22 formed adjacent the periphery 24 of the disc 18 and circumferentially spaced from each other such that the oppositely-flowing heating currents in the sectors disposed between the openings 22 are forced to be adjacent each other to cause a cancelling effect. The sectors should be less than forty-five degrees, and preferably about ten degrees. In the present example, the openings 22 comprise thirty-six rectangular slots having a width of about 0.5 mm and extending inward from the periphery 24 a distance equal to approximately R/2, where R is the radius of the disc 18. Although this embodiment discloses that all the radial openings 22 extend inward the same distance, the openings may also be designed so that they extend inward at different distances. We utilized the present type of susceptor disc 18 for conducting experiments to determine the heating effect such radial openings 22 would have during the rf heating of the disc 18.

Our experiments disclosed that when the discs 18 are in a stacked configuration, the radial openings 22 in the susceptor discs 18 actually cause the central portion 26 of each disc 18 to become hotter than the periphery 24. We believe that this change in temperature distribution may be attributable to the cancellation of a substantial amount of the induced electrical current, illustrated as dotted lines 28, which flows around the radial openings 22. Referring to FIG. 2 where our radial openings 22 are shown as rectangular slots, the induced electrical current flows inward at one side of each slot, around the end, and then outward at the opposite side. When the slots are spaced relatively close to each other, typically around 10 degrees from each other, the oppositely flowing currents 28 are forced to be adjacent each other and have a tendency to cancel each other, thereby limiting the induced heating effect at the periphery 24 of the disc 18. This cancelling phenomenon actually forces a greater density of current 28 to flow near the central portion 26 of the disc 18 and causes the central portion 26 to then do most of the heating. As a result, the central portion 26 becomes hotter, thereby providing one with the capability to change the temperature distribution by adjusting the dimensions, shape and spacing of such radial openings 22. One may then avoid the aforementioned undesirable temperature gradient and achieve a design which provides for the optimum temperature distribution throughout the disc 18.

Figure 3:
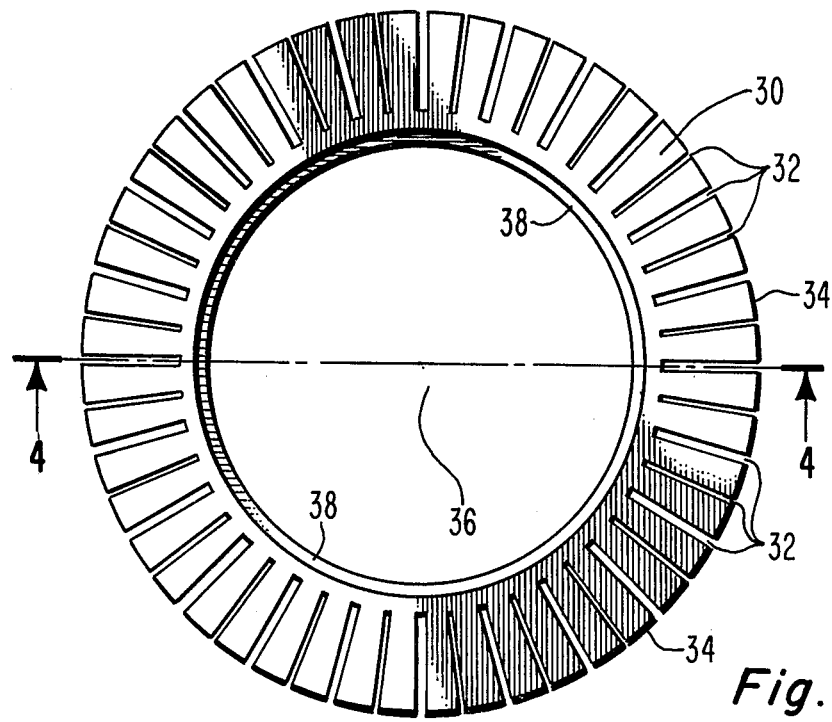
FIG. 3 is a plan view illustrating a second embodiment of the present novel susceptor disc.
Figure 4:
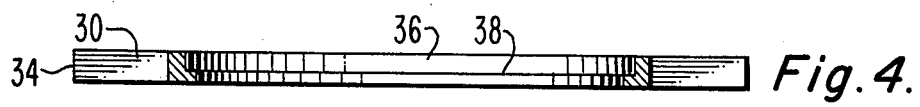
FIG. 4 is a cross-sectional view taken along line 4—4 of FIG. 3.

Referring to FIGS. 3 and 4 of the drawings, there is shown a second embodiment of the novel susceptor comprising a disc 30 having forty-eight rectangular slots 32 extending inward from the periphery 34 at a distance of approximately R/3, where R is the radius of the susceptor disc 30. The rectangular slots 32 have alternate widths of about 0.5 mm and 1.5 mm, respectively, as illustrated in FIG. 3. In the preferred embodiment of the present novel susceptor, the disc 30 has a circular aperture 36 disposed in the center thereof, as illustrated in FIG. 4. Adjacent the aperture 36 is a recessed ledge 38 adapted to hold a substrate (shown only in FIG. 5) so that both sides of the substrate may be substantially exposed.

Figure 5:
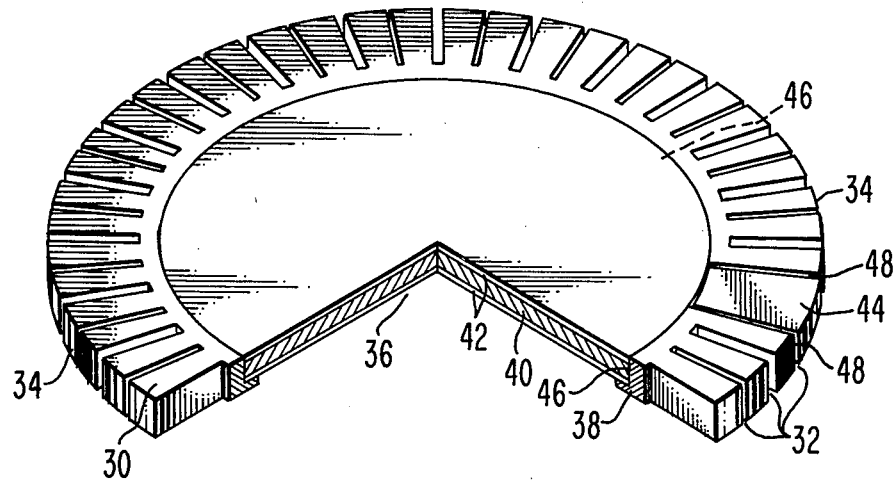
FIG. 5 is a perspective view illustrating the second embodiment of the novel susceptor disc holding two semiconductor wafers.

Referring to FIG. 5, there is shown the preferred embodiment of the susceptor further comprising a susceptor plate 40 adapted to fit within the aperture 36 adjacent the recessed ledge 38. Preferably, the plate 40 is sandwiched between two wafers 42, as illustrated in FIG. 5, wherein one of the wafers 42 rests upon the bottom of the ledge 38 of the disc 30 and supports the plate 40 positioned thereon, while the other wafer 42 is disposed on top of the plate 40, all being disposed within the aperture 36 of the disc 30. In the present example, the plate 40 has a handle 44 extending beyond the periphery 46 thereof. The handle 44 projects along a passage 46 cut completely through a section of the disc 30, and is designed to facilitate the loading of wafers 42 onto the susceptor disc 30.

Figure 6:
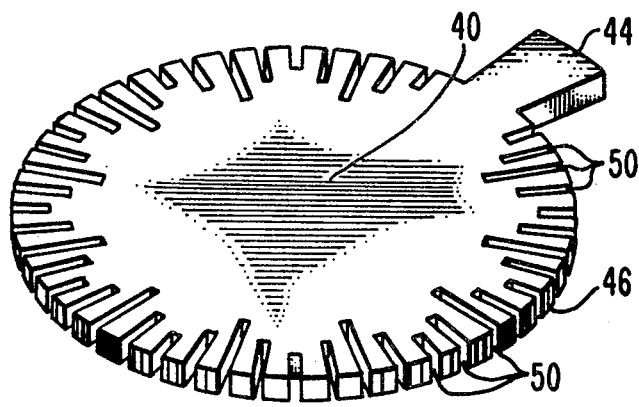
FIG. 6 is a perspective view of a susceptor plate adapted to fit in the center of the novel susceptor disc.

The susceptor plate 40 is made of a susceptor material of high electrical conductivity relative to the susceptor material of the disc 30. Preferably, the plate 40 is made of conventional graphite, which has a relatively high electrical conductivity and couples well with the rf induction field, while the susceptor disc 30 is made of vitreous carbon, which has a relatively low electrical conductivity and couples poorly with the rf induction field. The purpose of the susceptor plate 40 is to utilize the rf induction field for efficiently heating both wafers 42 positioned on opposite sides of the plate 40 within the surrounding susceptor disc 30. The vitreous carbon acts as a radiation shielding means which heats poorly due to its low electrical conductivity but reflects internally the heat radiating from the hotter conventional graphite which heats well due to its high electrical conductivity. The use of the two different materials enables a given rf induction field to heat the plate 40 more evenly due to the tendency of the vitreous carbon to act as a shield in reflecting the heat generated at the periphery of the conventional graphite plate 40 back towards the central portion of the plate 40, thereby preventing its loss to the ambient. The susceptor plate 40 may have radial slots 50 also formed adjacent the periphery 46 thereof and extending inward from the periphery 46 at different distances, as illustrated in FIG. 6. Such slots 50 would serve the same purpose as that described above for the radial openings 22. However, the adjacent wafers 42 should then comprise a non-conductive material which does not short out the induced electrical current flowing through the plate 40.

Figure 7:
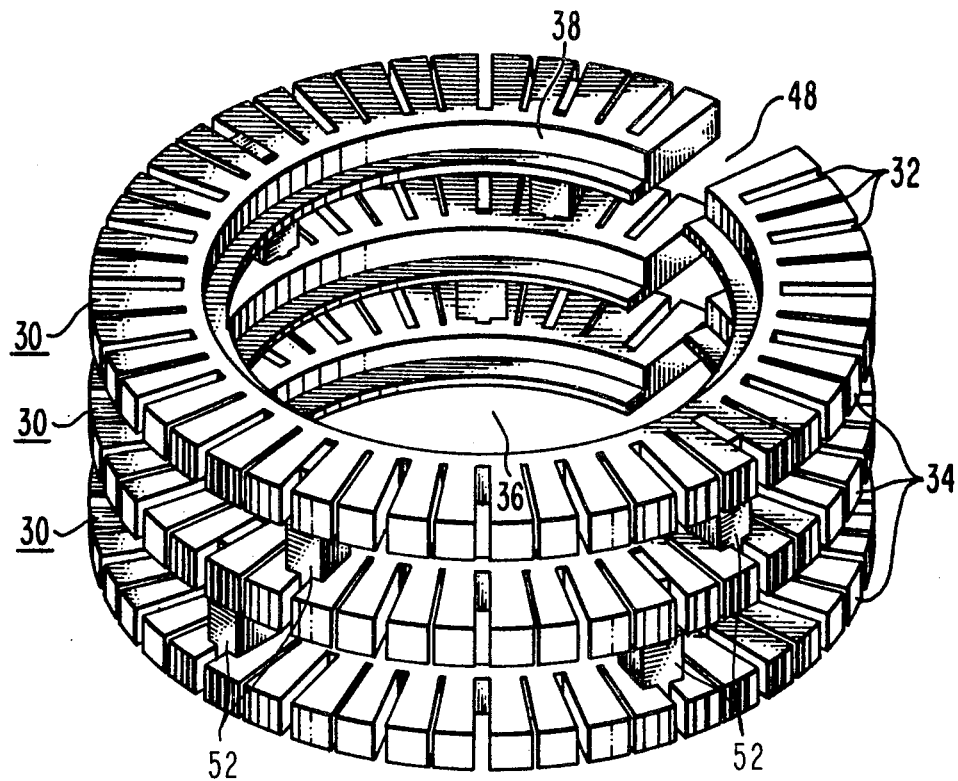
FIG. 7 is a perspective view of a plurality of the novel susceptor discs along with means for supporting the discs in a stack-like relationship.

Referring to FIG. 7 of the drawings, there is shown a susceptor wherein a plurality of the novel discs 30 are supported substantially parallel to each other in a stack-like relationship. Means for supporting the discs 30 in this manner may comprise a plurality of support posts 52 having the ends thereof adapted to fit into the larger rectangular slots 32. Such a susceptor could easily be incorporated into the rotary disc reactor. Although the present novel susceptor design is particularly desirable for chemically vapor-depositing epitaxial layers of silicon onto sapphire wafers using silane ($SiH_4$) as the source of the silicon, the present invention is applicable for use in other types of CVD processes, such as the deposition of non-epitaxial layers at atmospheric pressure or below. The novel susceptor structure is also desirable in any other application for adjusting the temperature distribution throughout the susceptor discs in order to achieve optimum heating conditions.

Figure 8:
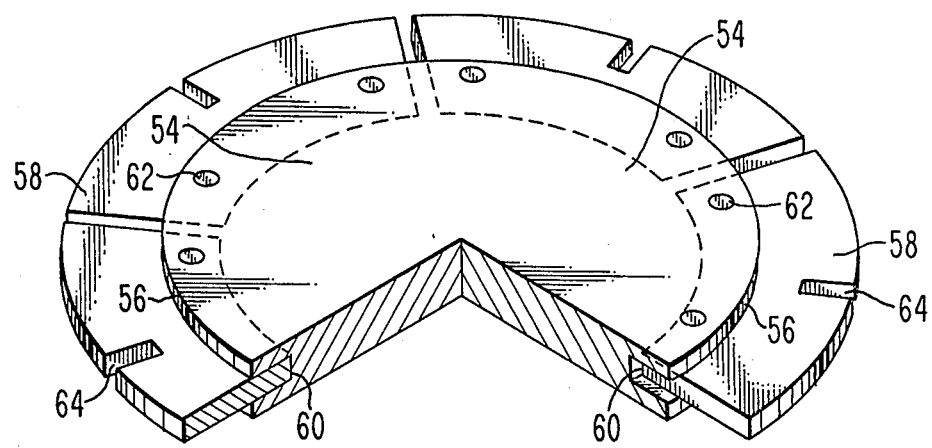
FIG. 8 is a perspective view illustrating a third embodiment of the novel susceptor disc.

Referring to FIG. 8 of the drawings, there is shown a third embodiment of the present novel susceptor comprising a disc 54 having radiation shielding means attached to and extending beyond a periphery 56 thereof. In the present example, the radiation shielding means comprises a plurality of distinct radial segments 58 spaced equidistantly along the periphery 56 and attached to a groove 60 made in the periphery 56 of the disc 54 by locking pins 62 made of vitreous carbon, as shown in FIG. 8. Each radial segment 58 may have one or more radial openings 64 formed adjacent the periphery thereof. The radiation shielding means may also comprise one continuous ring attached to the groove 60 made in the periphery 56 of the disc 54.

The disc 54 comprises a material of high electrical conductivity relative to the material of the radiation shielding means. Preferably, the disc 54 is made of conventional graphite which has a relatively high electrical conductivity and couples well with the rf induction field, while the distinct radial segments 58 are made of vitreous carbon, which has a relatively low electrical conductivity and couples poorly with the rf induction field. The radial segments 58 act as a radiation shielding means which heats poorly due to its low electrical conductivity but reflects internally the heat radiating from the hotter conventional graphite disc 54 which heats well due to its high electrical conductivity. The radial segments 58 may actually comprise any material which has an electrical conductivity lower than the disc 54 including a non-conductive material, such as aluminum oxide, as long as it is chemically compatible with the susceptor system. The use of the two different materials enables a given rf induction field to heat the disc 54 more evenly due to the tendency of the radial segments 58 to act as a shield in reflecting the heat generated in the periphery 56 of the conventional graphite disc 54 back towards the central portion of the disc 54, thereby preventing its loss to the ambient. The use of two different susceptor materials provides for an improved susceptor disc which avoids the aforementioned undesirable temperature gradient.

What is claimed is:

1. In a susceptor comprising a plurality of discs adapted for use in a rotary disc reactor, the improvement comprising:
   means for supporting said discs in a stack-like relationship wherein said discs are substantially parallel to each other, and each of said discs having a plurality of radial openings formed adjacent the periphery of said disc and circumferentially spaced from each other such that the oppositely-flowing heating currents in the sectors disposed between said openings are forced to be adjacent each other to cause a cancelling effect, each of said discs also having a circular aperture disposed in the center thereof and a susceptor plate adapted to fit within said aperture, each of said plates being of a susceptor material having a high electrical conductivity relative to the susceptor material of said discs along the basal planes parallel thereto.

2. A susceptor as defined in claim 1 wherein said discs are vitreous carbon and wherein said plates are conventional graphite.

3. A susceptor as defined in claim 2 wherein said sectors are less than forty-five degrees.

4. A susceptor as defined in claim 2 having a radius R wherein said openings comprise thirty-six rectangular slots having a width of about 0.5 mm and extending inward from said periphery a distance equal to approximately R/2.

5. A susceptor as defined in claim 2 having a radius R wherein said openings comprise forty-eight rectangular slots extending inward from said periphery a distance of approximately R/3 and having alternating widths of about 0.5 mm and 1.5 mm, respectively.

6. A susceptor as defined in claim 5 wherein each of said susceptor plates has a handle extending beyond the periphery of said plate.

7. A susceptor as defined in claim 6 wherein each of said susceptor plates has a plurality of radial slots formed adjacent the periphery of said plate, said slots extending inward from said periphery at different distances.

8. A susceptor as defined in claim 1 wherein said supporting means comprises a plurality of support posts having the ends thereof adapted to fit into said radial openings.

9. In a susceptor comprising a plurality of discs adapted for use in a rotary disc reactor, the improvement comprising:
    means for supporting said discs in a stack-like relationship wherein said discs are substantially parallel to each other, and
    radiation shielding means attached to and extending beyond the periphery of each of said discs, each of said discs being of a susceptor material having a high electrical conductivity relative to the material of said radiation shielding means along the basal planes parallel to said discs.

10. A susceptor as defined in claim 9 wherein said radiation shielding means is vitreous carbon and wherein said discs are conventional graphite.

11. A susceptor as defined in claim 10 wherein each of said radiation shielding means comprises a plurality of distinct radial segments spaced equidistantly along said periphery.

12. A susceptor as defined in claim 9 wherein each of said radiation shielding means has a plurality of radial openings formed adjacent the periphery thereof.

* * * * *